United States Patent
Shih (10) Patent No.: US 10,691,569 B2
(45) Date of Patent: Jun. 23, 2020

(54) SYSTEM AND METHOD FOR TESTING A DATA STORAGE DEVICE

(71) Applicant: Silicon Motion, Inc., Jhubei, Hsinchu County (TW)

(72) Inventor: Po-Yi Shih, Zhubei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/163,831

(22) Filed: Oct. 18, 2018

(65) Prior Publication Data
US 2019/0227894 A1    Jul. 25, 2019

(30) Foreign Application Priority Data

Jan. 19, 2018   (TW) .............................. 107102033 A (51) Int. Cl.
| | |
|---|---|
| *G06F 11/22* | (2006.01) |
| *G06F 9/26* | (2006.01) |
| *G06F 11/07* | (2006.01) |
| *G11C 29/00* | (2006.01) |

(52) U.S. Cl.
CPC .......... *G06F 11/2273* (2013.01); *G06F 9/267* (2013.01); *G06F 11/073* (2013.01); *G06F 11/2221* (2013.01); *G11C 29/00* (2013.01)

(58) Field of Classification Search
CPC .................................................. G06F 11/2273
USPC ................................ 714/718, 723, 720, 721
See application file for complete search history.

(56) References Cited

U.S. PATENT DOCUMENTS

| | | | |
|---|---|---|---|
| 8,640,007 B1 * | 1/2014 | Schulze | G06F 11/3656 714/30 |
| 2007/0011545 A1* | 1/2007 | Fan | G01R 31/3183 714/742 |
| 2015/0339186 A1* | 11/2015 | Sharon | H03M 13/1108 714/760 |
| 2017/0032843 A1* | 2/2017 | Ilani | G11C 16/10 |
| 2017/0117061 A1* | 4/2017 | Sharon | G11C 29/06 |
| 2019/0163255 A1* | 5/2019 | Dewey | G06F 1/3287 |
| 2019/0287526 A1* | 9/2019 | Ren | G10L 15/005 |

FOREIGN PATENT DOCUMENTS

| | | |
|---|---|---|
| CN | 1391164 A | 1/2003 |
| CN | 1925041 B | 6/2011 |
| CN | 103744787 A | 4/2014 |

* cited by examiner

*Primary Examiner* — Fritz Alphonse
(74) *Attorney, Agent, or Firm* — Winston Hsu (57) ABSTRACT

A system for testing a data storage device includes the data storage device, an electronic device and a computer device. The electronic device includes a host device coupled to the data storage device and communicating with the data storage device via an interface logic. The computer device is coupled to the electronic device and is configured to issue a plurality of commands to test the data storage device in a test procedure. When the electronic device has been successfully started up, the computer device issues a first command to the electronic device to trigger the electronic device to enter a hibernate mode. After waiting for a first predetermined period of time, the computer device issues a second command to the electronic device, so as to wake up the electronic device.

10 Claims, 6 Drawing Sheets

SYSTEM AND METHOD FOR TESTING A DATA STORAGE DEVICE

CROSS REFERENCE TO RELATED APPLICATIONS

This Application claims priority of Taiwan Patent Application No. 107102033, filed on Jan. 19, 2018, the entirety of which is incorporated by reference herein.

BACKGROUND OF THE INVENTION

Field of the Invention

The invention relates to a method for testing a data storage device, which can quickly and efficiently test a data storage device.

Description of the Related Art

With the rapid growth of data storage technology in recent years, many data storage devices—such as memory cards manufactured in compliance with the SD/MMC standards, CF standards, MS standards or XD standards, as well as solid state hard drives, Embedded Multi Media Cards (eMMC) and Universal Flash Storage (UFS)—have been used widely for a variety of purposes. Since these data storage devices have been used widely in a variety of host devices, how to quickly and efficiently test the stability of the data storage device when it is equipped in different host devices and the compatibility of the data storage device with different platforms becomes an important concern for the manufactures of the data storage devices.

In order to provide good performance when verifying a data storage device, a novel method for testing a data storage device is proposed, which can quickly and efficiently test the stability of the data storage device when it is equipped in a different host device, and the compatibility of the data storage device with different platforms.

BRIEF SUMMARY OF THE INVENTION

A system and method for testing a data storage device are provided. An exemplary embodiment of a system for testing a data storage device comprises the data storage device, an electronic device, and a computer device. The electronic device includes a host device coupled to the data storage device and communicating with the data storage device via an interface logic. The computer device is coupled to the electronic device and is configured to issue a plurality of commands to test the data storage device in a test procedure. When the electronic device has been successfully started up, the computer device issues a first command to the electronic device, to trigger the electronic device to enter a hibernate mode. After waiting for a first predetermined period of time, the computer device issues a second command to the electronic device, so as to wake up the electronic device.

An exemplary embodiment of a method for testing a data storage device, wherein the data storage device is coupled to an electronic device, the electronic device is coupled to a computer device, the computer device is configured to issue a plurality of commands to test the data storage device in a test procedure, comprising: when the electronic device has been successfully started up, the computer device issues a first command to the electronic device to trigger the electronic device to enter a hibernate mode; and after waiting for a first predetermined period of time, the computer device issues a second command to the electronic device to wake up the electronic device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
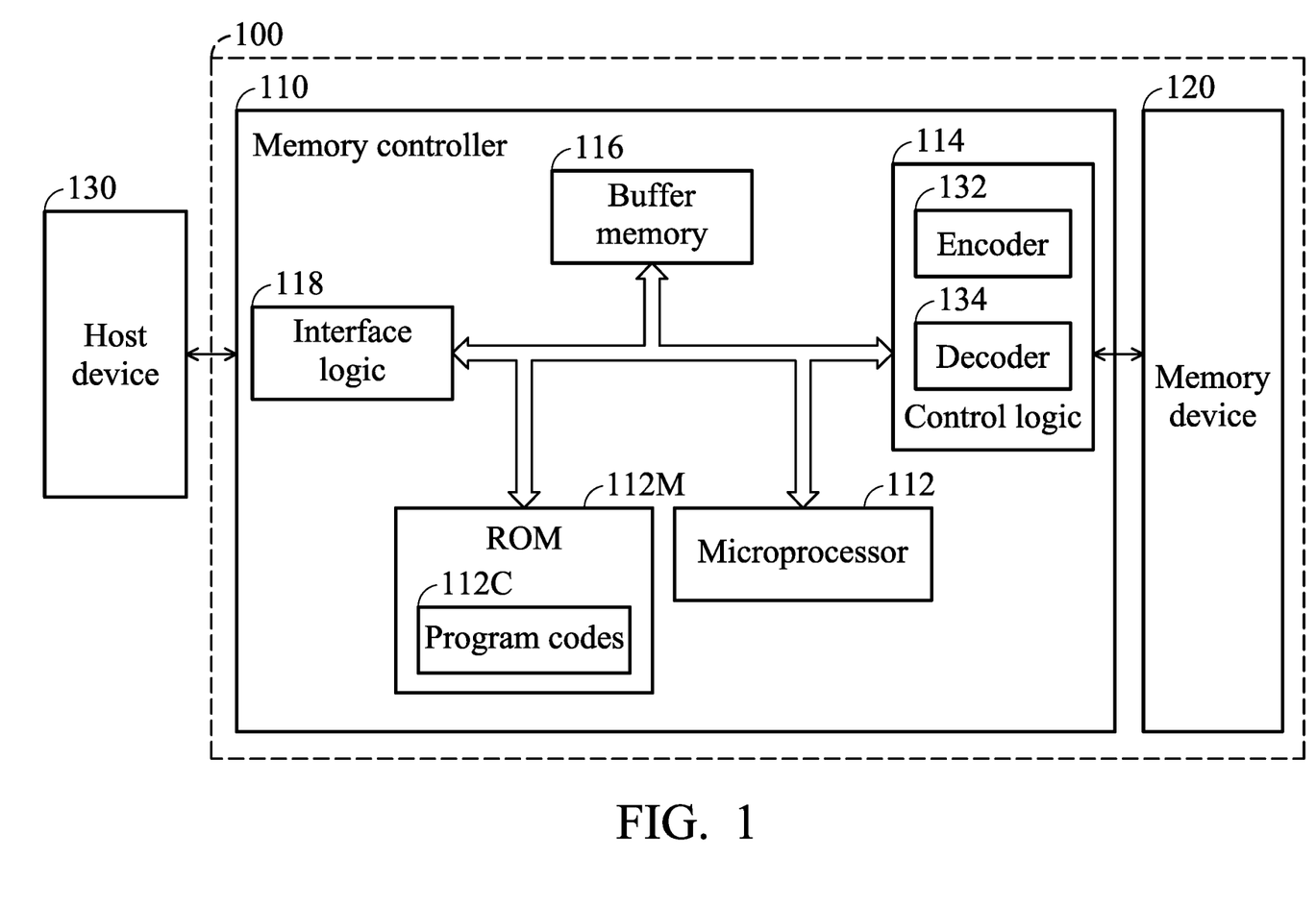
FIG. 1 shows an exemplary block diagram of a data storage device 100 according to an embodiment of the invention.

FIG. 1 shows an exemplary block diagram of a data storage device 100 according to an embodiment of the invention. The data storage device 100 may comprise a memory device 120, such as a flash memory module, and a memory controller 110. The memory controller 110 is configured to access the memory device 120. According to an embodiment of the invention, the memory controller 110 may comprise a microprocessor 112, a Read Only Memory (ROM) 112M, a control logic 114, a buffer memory 116 and an interface logic 118. The ROM 112M is configured to store program codes 112C. The microprocessor 112 is configured to execute the program codes 112C, thereby controlling access to the memory device 120. The control logic 114 may comprise an encoder 132 and a decoder 134. The encoder 132 is configured to encode the data to be written into the memory device 120 so as to generate corresponding correcting/checking code (also called error correction code (ECC)). The encoder 134 is configured decode the data read out from the memory device 120.

Typically, the memory device 120 may comprise a plurality of flash memory chips, and each flash memory chip may comprise a plurality of blocks. The access unit of an erase operation performed by the controller (e.g., the memory controller 112, through executing the program codes 112C by the microprocessor 112) on the memory device 120 may be one block. In addition, a block may record a predetermined number of pages, and the access unit of a write operation performed by the controller (e.g., the memory controller 112, through executing the program codes 112C by the microprocessor 112) on the memory device 120 may be one page.

In practice, the memory controller 110 may perform various control operations by using its own internal components through executing the program codes 112C by the microprocessor 112. For example, the memory controller 110 may use the control logic 114 to control the access operations (especially the access operation for at least a block or at least a page) of the memory device 120, use the buffer memory 116 to perform necessary data buffer operations, and use the interface logic 118 to communicate with a host device 130. The buffer memory 116 may be implemented by a Random Access Memory (RAM). For example, the buffer memory 116 may be an SRAM, but the invention should not be limited thereto.

In an embodiment of the invention, the data storage device 100 may be a portable storage device (for example, the memory card in compliance with the SD/MMC, CF, MS and/or XD standard), and the host device 130 may be an electronic device, such as a mobile phone, a notebook computer, a desktop computer . . . etc., capable of connecting to the data storage device. In another embodiment of the invention, the data storage device 100 may be a solid state hard disk or an embedded storage device in compliance with the Universal Flash Storage (UFS) or the Embedded Multi Media Card (EMMC) standards, and may be equipped in an electronic device such as a mobile phone, a notebook computer, or a desktop computer. In such an embodiment, the host device 130 may be a processor of the electronic device.

The host device 130 may issue commands, such as the read commands or the write commands, to the data storage device 100, so as to access the data stored in the memory device 120, or the host device 130 may issue commands to further control or manage the data storage device 100.

Figure 2:
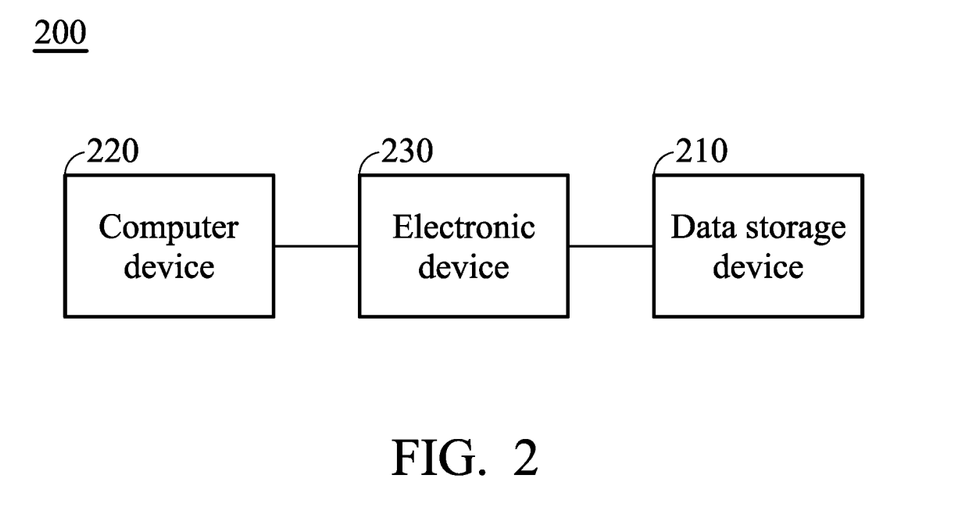
FIG. 2 is a schematic diagram showing a system for testing a data storage device according to an embodiment of the invention.

FIG. 2 is a schematic diagram showing a system for testing a data storage device according to an embodiment of the invention. The testing system 200 for testing the data storage device may comprise a computer device 220, an electronic device 230 and a data storage device 210. The computer device 220 may be coupled to the electronic device 230 and configured to issue a plurality of commands to test the operation stability of the data storage device 210 in a test procedure. The electronic device 230 may be a mobile phone, a notebook computer, a desktop computer . . . etc. In this embodiment, the data storage device 210 may be the embedded storage device in compliance with the UFS or the EMMC standards, and may be equipped in the electronic device 230.

For example, when the data storage device 210 is an embedded storage device in compliance with the UFS standards, the host device (not shown in FIG. 2) equipped inside of the electronic device 230 may be coupled to the data storage device 210 via the interface logic conforming to the UFS standards, and may communicate with the data storage device 210 via the interface logic. In another example, when the data storage device 210 is an embedded storage device in compliance with the EMMC standards, the host device equipped inside of the electronic device 230 may be coupled to the data storage device 210 via the interface logic conforming to the EMMC standards, and may communicate with the data storage device 210 via the interface logic.

Figure 3A:
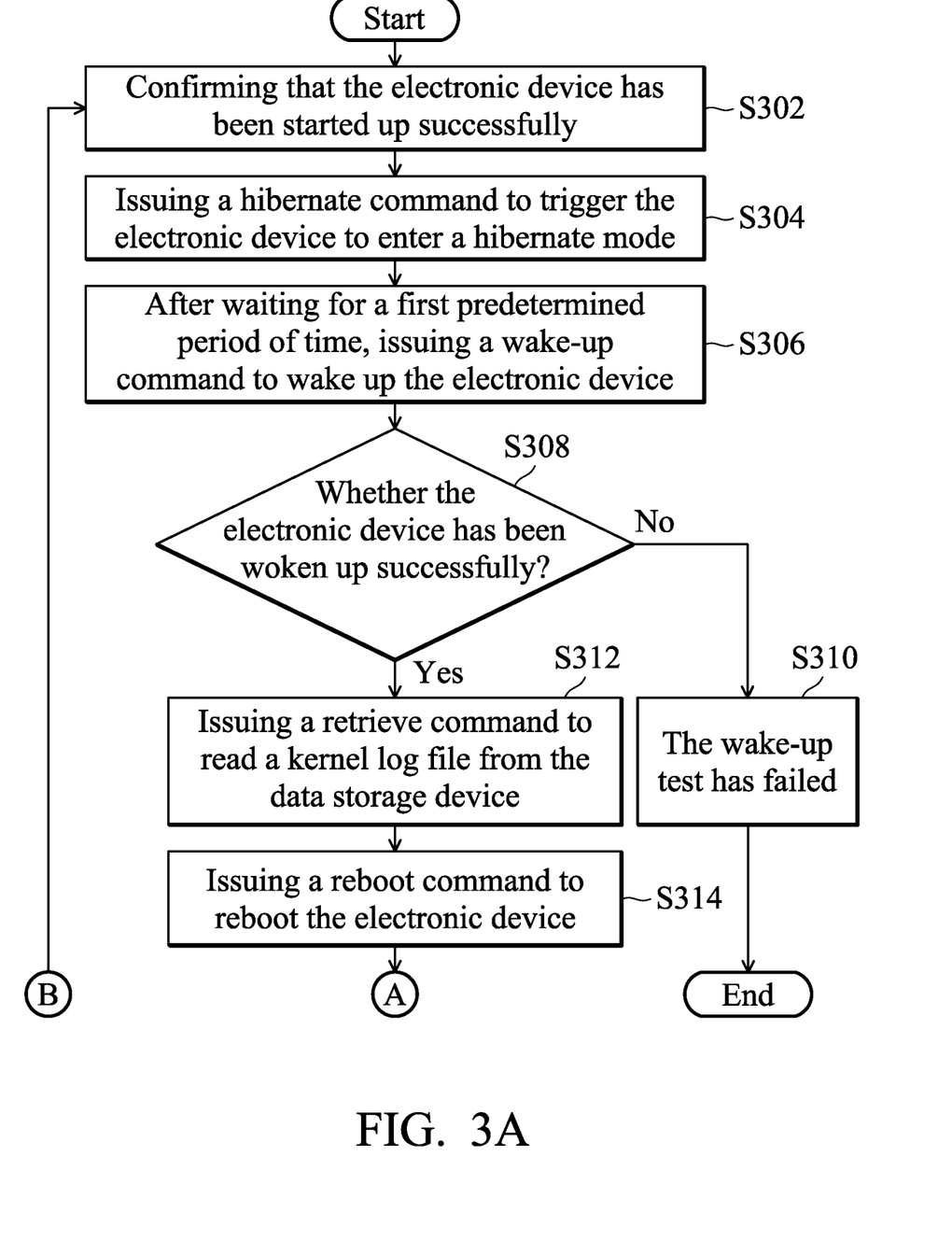
FIG. 3A and FIG. 3B show an exemplary flow chart of a method for testing a data storage device according to a first embodiment of the invention.
Figure 3B:
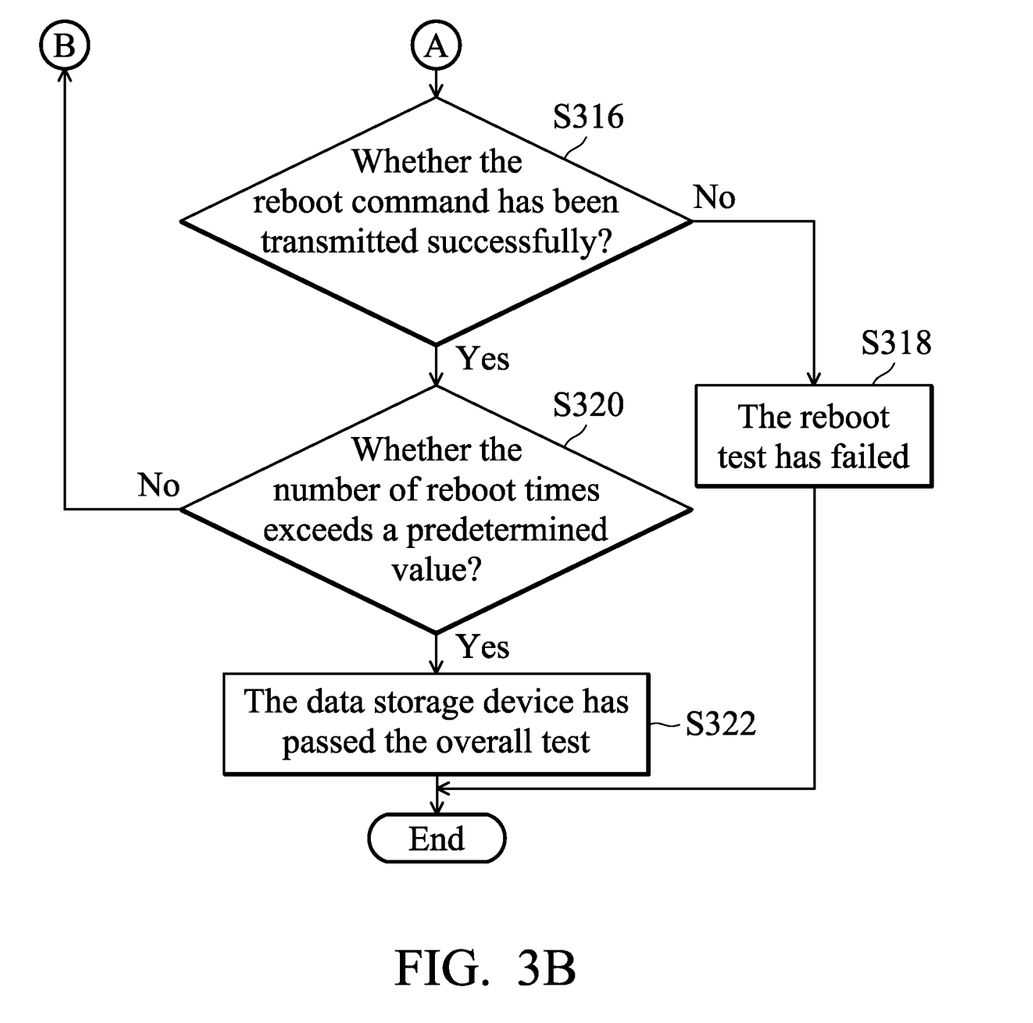

FIG. 3A and FIG. 3B show an exemplary flow chart of a method for testing a data storage device according to a first embodiment of the invention. First of all, the computer device 220 may confirm that the electronic device 230 has been successfully started up (Step S302). According to an embodiment of the invention, a tester can start up the electronic device 230 by pressing a power button of the electronic device 230. According to another embodiment of the invention, the computer device 220 may forcibly start or restart the electronic device 230 by issuing a power-on command or a reboot command to the electronic device 230.

According to an embodiment of the invention, the computer device 220 may issue one or more confirm commands to the electronic device 230 and determine whether the electronic device 230 has been successfully started up based on the response message replied by the electronic device 230. For example, when the value of a bit carried in the response message by the electronic device 230 is set to '1', it means that the electronic device 230 has been successfully started up. When the value of a bit carried in the response message by the electronic device 230 is set to '0', it means that the electronic device 230 has not been successfully started up, or the startup fails.

According to an embodiment of the invention, when the electronic device 230 is successfully started up for the first time, it can be considered that the electronic device 230 is started up successfully for the first time in the test procedure. The computer device 220 may determine whether the electronic device 230 has passed the first stage of the power-on test according to the way that the electronic device 230 is started up for the first time and the result of the first startup, or else may analyze the root cause of the power-on failure. For example, when the computer device 220 forces the electronic device 230 to start up by issuing a power-on command and the startup of the electronic device 230 fails, the failure may be due to the unstable signal transmission in the signal transmission layer (the physical layer) or the transport protocol layer inside of the electronic device 230 or the data storage device 210, which may cause the transmission of the power-on related commands to be unsuccessful.

After confirming that the electronic device 230 has been successfully started up, the computer device 220 may issue a hibernate command (the first command) to the electronic device 230 to trigger the electronic device 230 to enter a hibernate mode (Step S304). When the electronic device 230 has successfully received the hibernate command from the computer device 220, the electronic device 230 may respond to the computer device 220 by transmitting an acknowledgement (ACK) signal to the computer device 220, and the computer device 220 may determine whether the electronic device 230 has entered the hibernate mode based on the acknowledgement signal.

When the electronic device 230 has entered the hibernate mode, the screen of the electronic device 230 may be turned off and the electronic device 230 may operate in a low power consumption mode. In the hibernate mode, the data storage device 210 will not perform any read and write operations.

Next, after waiting for a predetermined period of time DEVICE SUSPEND TIME (the first predetermined period of time), the computer device 220 may issue a wake-up command (the second command) to the electronic device 230, so as to wake up the electronic device 230 (Step S306).

The computer device 220 may issue a confirm signal to the electronic device 230 to confirm whether the electronic device 230 has been woken up successfully (Step S308).

According to an embodiment of the invention, the computer device 220 may test whether communication with the electronic device 230 functions normally when the electronic device 230 operates in the hibernate mode via steps S304~S308. If the electronic device 230 cannot awake from the hibernate mode, the computer device 220 may determine that the data storage device 210 cannot pass the second stage of the wake-up test (Step S310). Based on this failure, the computer device 220 may further analyze the root cause of the wake-up failure. For example, the unstable or poor signal quality inside of the electronic device 230 or the data storage device 210 may both cause the electronic device 230 to be unable to awake from the hibernate mode.

When the electronic device 230 can be waked up successfully from the hibernate mode in response to the wake-up command, the computer device 220 may further issue a retrieve command (the third command) to the electronic device 230 to request the electronic device 230 or the corresponding host device to read a kernel log file from the data storage device 210 and transmit the kernel log file to the computer device 220 (Step S312).

The kernel log file is maintained by the electronic device 230 for recording all the events that occur during the operation of the electronic device 230. The computer device 220 may analyze the content of the kernel log file by executing some predefined programs, so as to determine the root cause of the previous test failure. For example, the computer device 220 may find out whether there is a test failure due to an abnormality of the data storage device 210 by searching for the keywords recorded in the kernel log file.

For example, the keyword "_ufs_do_card_reset" may indicate that a setting error has occurred in the data storage device 210 (for example, the UFS device) and the electronic device 230 has reset the data storage device 210. The keyword "hibern8 enter failed" may indicate that some error has occurred when the data storage device 210 enters the hibernate mode. The keyword "hibern8 exit failed" may indicate that some error has occurred when the data storage device 210 leaves the hibernate mode. The keyword "ufshcd_abort" may indicate that operations of the data storage device 210 has been aborted, which may usually accompanying with the error of entering/leaving the hibernate mode. The keyword "query_flag_retry" may indicate that some error has occurred when the data storage device 210 transmits the parameter message.

Next, the computer device 220 may issue a reboot command (the fourth command) to the electronic device 230 to reboot the electronic device (Step S314).

When the electronic device 230 receives the reboot command from the computer device 220 successfully, the electronic device 230 may respond to the computer device 220 by transmitting an acknowledgement (ACK) signal to the computer device 220 to inform the computer device 220 that electronic device 230 has rebooted. The computer device 220 may determine whether the reboot command has been transmitted successfully based on the acknowledgement signal (Step S316). For example, the computer device 220 may set another predetermined time DEVICE_REBOOTING_TIME (the second predetermined time). When the computer device 220 cannot receive any acknowledgement signal within the predetermined time DEVICE_REBOOTING_TIME, it is determined that the reboot command cannot be transmitted successfully within the predetermined time DEVICE_REBOOTING_TIME and the data storage device 210 cannot pass the third stage of the reboot test (Step S318).

When the computer device 220 received the acknowledgement signal from the electronic device 230 within the predetermined time DEVICE_REBOOTING_TIME, it is determined that the reboot command can be transmitted successfully. Next, the computer device 220 may further determine whether the number of times the electronic device 230 was rebooted during the test procedure exceeds a predetermined value (Step S320). According to an embodiment of the invention, the computer device 220 may be configured to keep counting the number of times the electronic device 230 was rebooted during the test procedure.

For example, every time that the electronic device 230 transmits the ACK signal to the computer device 220 to inform the computer device 220 that the reboot has been performed by the electronic device 230, the computer device 220 may increase the number of times the electronic device 230 was rebooted by 1. When the number of times the electronic device 230 was rebooted during the test procedure exceeds a predetermined value TOTAL_DEVICE_REBOOT_LOOP, it means that the number of times that the electronic device 230 has been rebooted already exceeds the threshold value predefined by the testing system. In this manner, the computer device 230 may determine that the data storage device 210 has passed the overall test (Step S322).

On the other hand, if the number of times the electronic device 230 was rebooted during the test procedure does not exceed a predetermined value TOTAL_DEVICE_REBOOT_LOOP, it means that the number of times that the electronic device 230 has been rebooted does not exceed the threshold value predefined by the testing system. In this manner, the test procedure may return to the step S302, for the computer device 220 to confirm that the electronic device 230 has been successfully started up, again.

According to an embodiment of the invention, in the test procedure, different tests are arranged at different times (for example, the power-on test in the first stage, the wake-up test in the second stage and the reboot test in the third stage). Using this arrangement, when there are any operation errors that have occurred at the electronic device 230 side or the data storage device 210 side, the computer device 220 may quickly determine the error type based on the suspended step in the test procedure, the history of performing the test procedure and the communication messages transmitted between the computer device 220 and the electronic device 230. For example, the computer device 220 may determine whether the electronic device 230 has passed the first stage of power-on test based on the way and the result of the electronic device 230 being started-up for the first time, or may analyze the root cause of the power-on failure.

In another example, the computer device 220 may also determine whether there are any errors that have occurred when the data storage device 210 enters/leaves the hibernate mode based on whether the electronic device 230 can successfully awake from the hibernate mode.

In another example, the computer device 220 may also determine whether the error in switching from the low speed mode to the high speed mode has occurred or the power mode synchronization error (device power mode Sync error) has occurred based on whether the electronic device 230 can successfully receive the reboot command and/or whether the electronic device 230 can be successfully rebooted (this is because when rebooting, the data transfer speed of the interface logic between the host device and the data storage device 210 will be set to a low speed mode first and then set to a high speed mode after the host device has successfully sent out the command LinkStartUP or LineReset to request for reboot).

In addition, since the kernel log file records all the event occurred during the operation of the electronic device 230, the computer device 220 can obtain the kernel log file after the electronic device 230 is started up successfully and determine the root cause of previous test failure (if there is) by analyzing the content of the kernel log file.

Figure 4A:
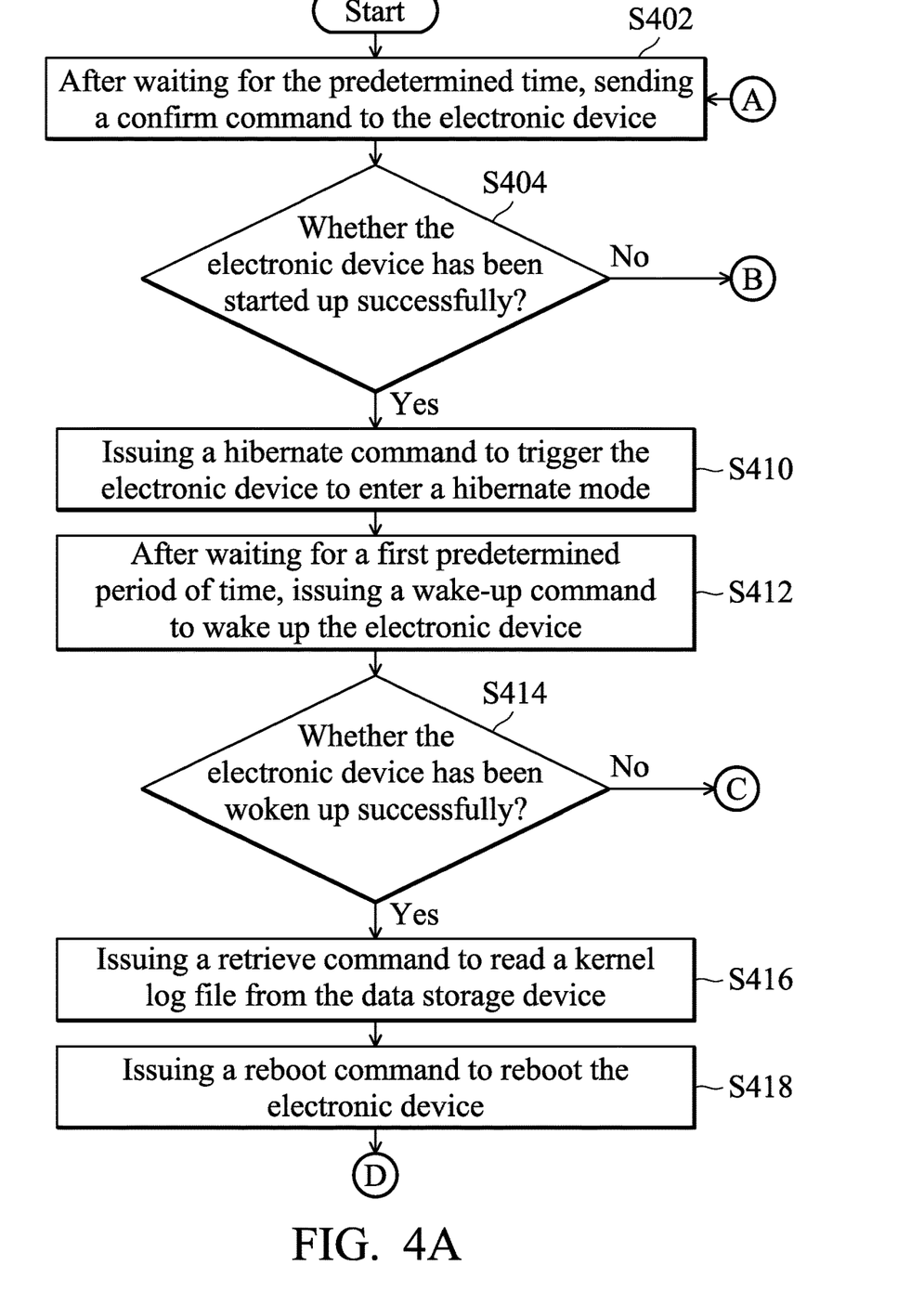
FIG. 4A and FIG. 4B show an exemplary flow chart of a method for testing a data storage device according to a second embodiment of the invention.
Figure 4B:
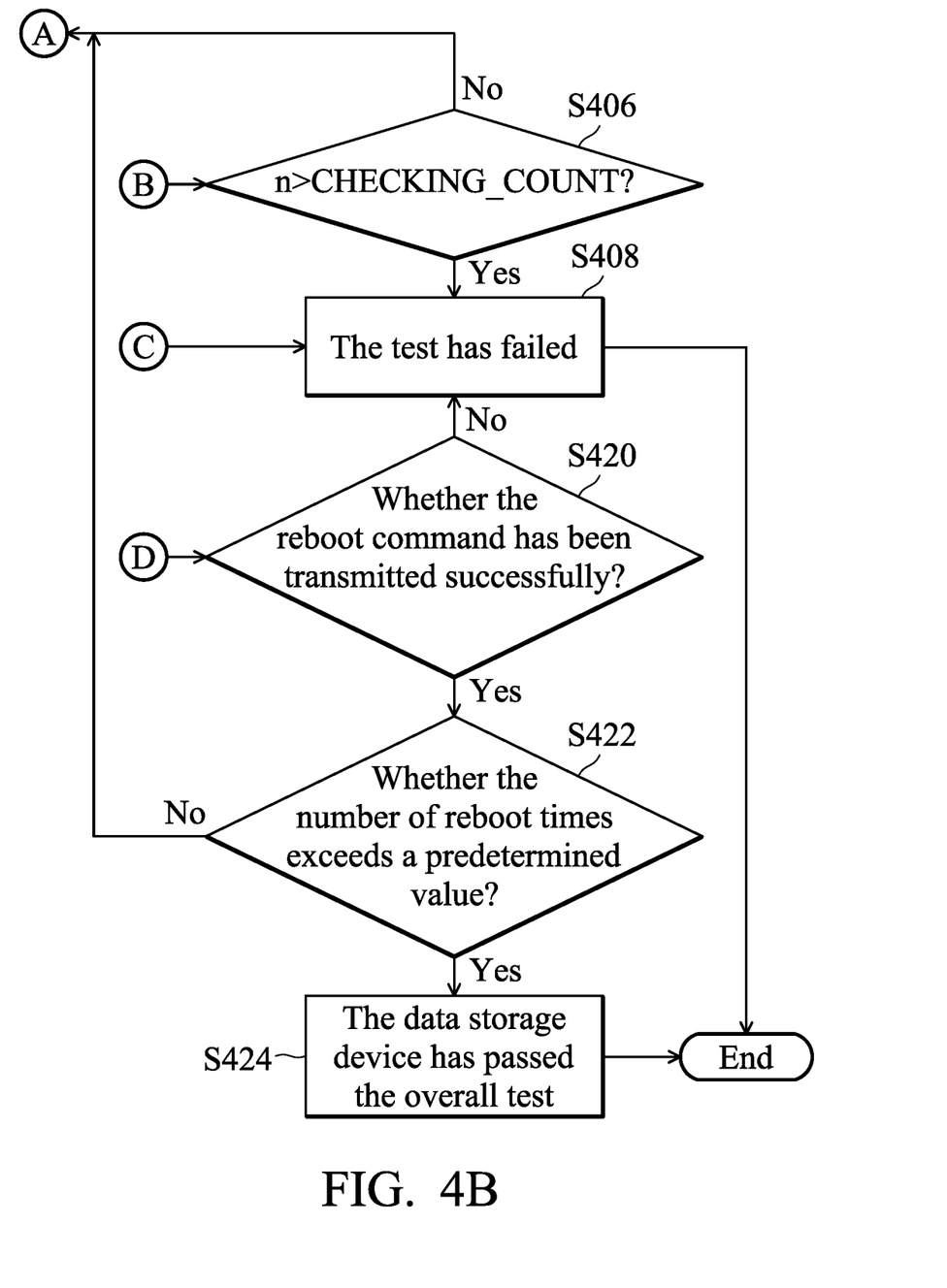

FIG. 4A and FIG. 4B show an exemplary flow chart of a method for testing a data storage device according to a second embodiment of the invention. First of all, the computer device 220 may confirm that the electronic device 230 has been started up successfully. According to an embodiment of the invention, a tester can start up the electronic device 230 by pressing a power button of the electronic device 230. According to another embodiment of the invention, the computer device 220 may forcibly start or restart the electronic device 230 by issuing a power-on command or a reboot command to the electronic device 230.

According to an embodiment of the invention, the computer device 220 may set a predetermined period of time WAIT_DEVICE_CHECKING_TIME (the third predetermined period of time) and after waiting for the predetermined time WAIT_DEVICE_CHECKING_TIME, send a confirm command (the fifth command) to the electronic device 230 (Step S402) to check whether the electronic device 230 has been started up successfully (Step S404).

According to an embodiment of the invention, the computer device 220 may issue one or more confirm commands to the electronic device 230 and determine whether the electronic device 230 has been successfully started up based on the response message replied by the electronic device 230. For example, when the value of a bit carried in the response message by the electronic device 230 is set to 1', it means that the electronic device 230 has been successfully started up. When the value of a bit carried in the response message by the electronic device 230 is set to '0', it means that the electronic device 230 has not been successfully started up, or the startup fails.

In addition, according to an embodiment of the invention, the computer device 220 may accumulate a confirmation count value n every time that a confirm command has been issued. If the electronic device 230 cannot be started up successfully, the computer device 220 may further determine whether the confirmation count value n exceeds a confirmation threshold value CHECKING_COUNT (Step S406). If the confirmation count value does not exceed the confirmation threshold value CHECKING_COUNT, the test procedure may return to the step S402, for the computer device 220 to confirm that the electronic device 230 has been successfully started up, again. If the confirmation count value exceeds the confirmation threshold value CHECKING_COUNT, it means that the number of times a confirmation has been performed has exceeded the confirmation threshold predefined by the testing system. In this manner, the computer device 220 may determine that the test has failed (Step S408).

According to an embodiment of the invention, based on the suspended step in the test procedure, the history of performing the test procedure and the communication messages transmitted between the computer device 220 and the electronic device 230, the computer device 220 can determine that the current test failure occurred because the electronic device 230 cannot pass the first stage of the power-on test. In addition, according to an embodiment of invention, the computer device 220 may also determine the root cause of power-on failure based on the way that the electronic device 230 is started up for the first time and the result of the first, startup. For example, when the computer device 220 forces the electronic device 230 to start up by issuing a power-on command and the startup of the electronic device 230 fails, the failure may be caused by the unstable signal transmission in the signal transmission layer (the physical layer) or the transport protocol layer inside of the electronic device 230 or the data storage device 210, which may cause the power-on related commands cannot be successfully transmitted.

On the other hand, after confirming that the electronic device 230 has been successfully started up, the computer device 220 may issue a hibernate command (the first command) to the electronic device 230 to trigger the electronic device 230 to enter a hibernate mode (Step S410). When the electronic device 230 has successfully received the hibernate command from the computer device 220, the electronic device 230 may respond to the computer device 220 by transmitting an acknowledgement (ACK) signal to the computer device 220, and the computer device 220 may determine whether the electronic device 230 has entered the hibernate mode based on the acknowledgement signal.

When the electronic device 230 has entered the hibernate mode, the screen of the electronic device 230 may be turned off and the electronic device 230 may operate in a low power consumption mode. In the hibernate mode, the data storage device 210 will not perform any read or write operations.

Next, after waiting for a predetermined period of time DEVICE SUSPEND TIME (the first predetermined period of time), the computer device 220 may issue a wake-up command (the second command) to the electronic device, so as to wake up the electronic device 230 (Step S412).

The computer device 220 may issue a confirm signal to the electronic device 230 to confirm whether the electronic device 230 has been woken up successfully (Step S414).

According to an embodiment of the invention, the computer device 220 may test whether communication with the electronic device 230 functions normally when the electronic device 230 operates in the hibernate mode via steps S410~S414. If the electronic device 230 cannot awake from the hibernate mode, the computer device 220 may determine that the data storage device 210 cannot pass the test (Step S408).

It should be noted that based on the suspended step in the test procedure, the history of performing the test procedure and the communication messages transmitted between the computer device 220 and the electronic device 230, the computer device 220 can determine that the current test failure occurred because the electronic device 230 cannot pass the second stage of the wake-up test. In addition, the computer de e 220 may also determine the root cause of the test failure. For example, the unstable or poor signal quality inside of the electronic device 230 or the data storage device 210 may both cause the electronic device 230 to be unable to awake from the hibernate mode.

When the electronic device 230 can be waked up successfully from the hibernate mode in response to the wake-up command, the computer device 220 may further issue a retrieve command (the third command) to the electronic device 230 to request the electronic device 230 or the corresponding host device to read a kernel log file from the data storage device 210 and transmit the kernel log file to the computer device 220 (Step S416).

The kernel log file is maintained by the electronic device 230 for recording all the events that occur during the operation of the electronic device 230. The computer device 220 may analyze the content of the kernel log file by executing some predefined programs, so as to determine the root cause of the previous test failure. For example, the computer device 220 may find out whether there is a test failure due to an abnormality of the data storage device 210 by searching for keywords recorded in the kernel log file.

For example, the keyword "ufs_do_card_reset" may indicate that setting error has occurred in the data storage device 210 (for example, the UFS device) and the electronic device 230 has reset the data storage device 210. The keyword "hibern8 enter failed" may indicate that some error has occurred when the data storage device 210 enters the hibernate mode. The keyword "hibern8 exit failed" may indicate that some error has occurred when the data storage device 210 leaves the hibernate mode. The keyword "ufshcd_abort" may indicate that operations of the data storage device 210 has been aborted, which may usually accompanying with the error of entering/leaving the hibernate mode. The keyword "query_flag_retry" may indicate that some error has occurred when the data storage device 210 transmits the parameter message.

Next, the computer device 220 may issue a reboot command (the fourth command) to the electronic device 230 to reboot the electronic device 230 (Step S418).

When the electronic device 230 receives the reboot command from the computer device 220 successfully, the electronic device 230 may respond to the computer device 220 by transmitting an acknowledgement (ACK) signal to the computer device 220 to inform the computer device 220 that the reboot has been performed. The computer device 220 may determine whether the reboot command has been transmitted successfully based on the acknowledgement signal (Step S420). For example, the computer device 220 may set another predetermined time DEVICE_REBOOTING_TIME (the second predetermined time). When the computer device 220 cannot receive any acknowledgement signal within the predetermined time DEVICE_REBOOTING_TIME, it is determined that the reboot command cannot be transmitted successfully within the predetermined time DEVICE_REBOOTING_TIME and the data storage device 210 cannot pass the test (Step S408). As discussed above, based on the suspended step in the test procedure, the history of performing the test procedure and the communication messages transmitted between the computer device 220 and the electronic device 230, the computer device 220 can determine that the current test failure has occurred because the data storage device 210 cannot pass the third stage of the reboot test.

When the computer device 220 received the acknowledgement signal from the electronic device 230 within the predetermined time DEVICE_REBOOTING_TIME, it is determined that the reboot command can be transmitted successfully. Next, the computer device 220 may further determine whether the number of times the electronic device 230 was rebooted during the test procedure exceeds a predetermined value (Step S422). According to an embodiment of the invention, the computer device 220 may be configured to keep counting the number of times the electronic device 230 was rebooted during the test procedure. For example, every time that the electronic device 230 transmits the ACK signal to the computer device 220 to inform the computer device 220 that the reboot has been performed, the computer device 220 may increase the number of times the electronic device 230 was rebooted by 1. When the number of times the electronic device 230 was rebooted during the test procedure exceeds a predetermined value TOTAL_DEVICE_REBOOT_LOOP, it means that the number of times that the electronic device 230 has been rebooted already exceeds the threshold value predefined by the testing system. In this manner, the computer device 230 may determine that the data storage device 210 has passed the overall test (Step S424).

On the other hand, if the number of times the electronic device 230 was rebooted during the test procedure does not exceed a predetermined value TOTAL_DEVICE_REBOOT_LOOP, it means that the number of times that the electronic device 230 has been rebooted does not exceed the threshold value predefined by the testing system. In this manner, the test procedure may return to the step S402, for the computer device 220 to confirm that the electronic device 230 has been successfully started up, again.

As discussed above, according to an embodiment of the invention, in the test procedure, different tests are arranged at different times (for example, the power-on test in the first stage, the wake-up test in the second stage and the reboot test in the third stage). Using this arrangement, when there are any operation errors that have occurred at the electronic device 230 side or the data storage device 210 side, the computer device 220 may quickly determine the error type based on the suspended step in the test procedure, the history of performing the test procedure and the communication messages transmitted between the computer device 220 and the electronic device 230. For example, the computer device 220 may determine whether the electronic device 230 has passed the first stage of power-on test based on the way and the result of the electronic device 230 being started-up for the first time, or may analyze the root cause of the power-on failure.

In another example, the computer device 220 may also determine whether there are any errors that have occurred when the data storage device 210 enters/leaves the hibernate mode based on whether the electronic device 230 can successfully awake from the hibernate mode.

In another example, the computer device 220 may also determine whether the error in switching from the low speed mode to the high speed mode has occurred, the power mode synchronization error (device power mode Sync error) or DMR Reset timing error has occurred based on whether the electronic device 230 can successfully receive the reboot command and/or whether the electronic device 230 can be successfully rebooted (this is because when rebooting, the data transfer speed of the interface logic between the host device and the data storage device 210 will be set to a low speed mode first and then set to a high speed mode after the host device has successfully sent out the command LinkStartUP or LineReset to request for reboot).

In addition, since the kernel log file records all the event occurred during the operation of the electronic device 230, the computer device 220 can obtain the kernel log file after the electronic device 230 is started up successfully and determine the root cause of previous test failure (if there is) by analyzing the content of the kernel log file.

Generally, in the verification stage of the electronic device, the stabilities of the internal components configured inside of the system can be tested via the rebooting test. For example, the connection between the data storage device and the host device can be stably established after the data storage device is powered-off/powered-on and the power-on procedure can be completed should be assured. However, in the conventional designs, since the verification of the electronic device is performed via the application programs (APK) installed inside of the electronic device, it will take a long time to wait for the same error to happen again. This is because there are no error messages being recorded when the electronic device cannot be started-up successfully, and this indirectly extends the debugging time and increases the difficulty of finding the root cause.

To solve the above-mentioned problems, novel system and methods, which can quickly and efficiently test a data storage device, are proposed. The proposed system and methods can quickly and efficiently test the stability of the data storage device when it is equipped in different host device and the compatibility of the data storage device with different platforms, and can also shorten the time needed to start the test. In this manner, the problem of long tests and the debugging time required by the conventional design can be solved, and the error detection rate can also be greatly increased. In the test procedure, different tests are arranged at different times (for example, the power-on test in the first stage, the wake-up test in the second stage and the reboot test in the third stage). Using this arrangement, when there are any operation errors that have occurred at the electronic device 230 side or the data storage device 210 side, the computer device 220 may quickly determine the error type based on the suspended step in the test procedure, the history of performing the test procedure and the communication messages transmitted between the computer device 220 and the electronic device 230, thereby facilitating the research and developer to quickly check the error point and find out the root cause of test failure, and then accordingly come out proper solutions.

In addition, the test method proposed by the invention can be controlled automatically by a computer device, and can be performed on a plurality of electronic devices at the same time. Compared with the conventional technology, the test efficiency can be greatly improved, and the problems of the conventional technology can be solved. In addition, in the proposed test method, when the test failure is detected, the test procedure can be stopped, and the execution record of the test program is retained. Thereafter, the computer device is used to analyze each record file, thereby effectively improving the error detection rate Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A system for testing a data storage device, comprising:
   the data storage device;
   an electronic device, comprising a host device coupled to the data storage device and configured to communicate with the data storage device via an interface logic; and
   a computer device, coupled to the electronic device and configured to issue a plurality of commands to test operation stability of the data storage device when being coupled to the electronic device in a test procedure,
   wherein when the electronic device has been successfully started up, the computer device issues a first command to the electronic device to trigger the electronic device to enter a hibernate mode, and after waiting for a first predetermined period of time, the computer device issues a second command to the electronic device, so as to wake up the electronic device.

2. The system as claimed in claim 1, wherein when the electronic device is woken up in response to the second command, the computer device is further configured to issue a third command to the electronic device to request the host device to read a kernel log file from the data storage device and transmit the kernel log file to the computer device.

3. The system as claimed in claim 1, wherein when the electronic device is woken up in response to the second command, the computer device is further configured to issue a fourth command to the electronic device to trigger the electronic device to reboot.

4. The system as claimed in claim 3, wherein the computer device is further configured to count a number of times the electronic device was rebooted during the test procedure.

5. The system as claimed in claim 4, wherein when the number of times the electronic device was rebooted during the test procedure exceeds a predetermined value, the computer device determines that the data storage device has passed the test.

6. A method for testing a data storage device, wherein the data storage device is coupled to an electronic device, the electronic device is coupled to a computer device, the computer device is configured to issue a plurality of commands to test operation stability of the data storage device when being coupled to the electronic device in a test procedure, the method comprising:
   when the electronic device has been successfully started up, issuing a first command to the electronic device, by the computer device, to trigger the electronic device to enter a hibernate mode; and
   after waiting for a first predetermined period of time, issuing a second command to the electronic device, by the computer device, to wake up the electronic device.

7. The method as claimed in claim 6, further comprising:
   when the electronic device is woken up in response to the second command, issuing a third command to the electronic device, by the computer device, to request that the electronic device read a kernel log file from the data storage device and transmit the kernel log file to the computer device.

8. The method as claimed in claim 6, further comprising:
   when the electronic device is woken up in response to the second command, issuing a fourth command to the electronic device, by the computer device, to trigger the electronic device to reboot.

9. The method as claimed in claim 6, further comprising:
   counting a number of times the electronic device was rebooted during the test procedure.

10. The method as claimed in claim 9, further comprising:
    determining that the data storage device has passed the test when the number of times the electronic device was rebooted during the test procedure exceeds a predetermined value.

* * * * *